United States Patent
Clark et al.

(10) Patent No.: US 6,512,401 B2
(45) Date of Patent: *Jan. 28, 2003

(54) OUTPUT BUFFER FOR HIGH AND LOW VOLTAGE BUS

(75) Inventors: Lawrence T. Clark, Phoenix, AZ (US); Thomas J. Mozdzen, Gilbert, AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/393,134

(22) Filed: Sep. 10, 1999

(65) Prior Publication Data

US 2001/0043094 A1 Nov. 22, 2001

(51) Int. Cl.[7] ................................................. H03K 3/00
(52) U.S. Cl. ..................... 327/112; 327/328; 327/333; 327/391
(58) Field of Search ................................. 327/108, 112, 327/327, 328, 333, 391

(56) References Cited

U.S. PATENT DOCUMENTS

| | | | |
|---|---|---|---|
| 4,038,564 A | * | 7/1977 | Hakata .......................... 327/87 |
| 4,408,135 A | * | 10/1983 | Yuyama et al. ................ 327/87 |
| 4,731,553 A | * | 3/1988 | Van Lehn et al. ............. 326/87 |
| 4,853,560 A | | 8/1989 | Iwamura et al. |
| 5,095,230 A | * | 3/1992 | Takai et al. .................... 326/87 |
| 5,097,152 A | * | 3/1992 | Kohda et al. .................. 326/87 |
| 5,341,045 A | * | 8/1994 | Almulla ...................... 327/83 B |
| 5,399,918 A | | 3/1995 | Taylor et al. ................. 326/110 |
| 5,739,700 A | * | 4/1998 | Martin .......................... 326/87 |
| 5,748,303 A | | 5/1998 | Korta et al. .................. 356/229 |
| 5,811,991 A | * | 9/1998 | Takashima .................... 326/87 |
| 5,830,795 A | | 11/1998 | Mehta et al. |
| 5,859,450 A | | 1/1999 | Clark et al. |
| 5,894,238 A | * | 4/1999 | Chien .......................... 327/112 |
| 5,914,618 A | * | 6/1999 | Mattos .......................... 326/87 |
| 5,939,936 A | | 8/1999 | Beiley et al. ................. 327/537 |
| 6,040,592 A | | 3/2000 | McDaniel et al. |
| 6,043,683 A | * | 3/2000 | Bae ............................... 327/87 |
| 6,057,586 A | | 5/2000 | Bawolek et al. |
| 6,118,482 A | | 9/2000 | Clark et al. |
| 6,133,563 A | | 10/2000 | Clark et al. |
| 6,133,749 A | * | 10/2000 | Hansen et al. ................. 326/30 |
| 6,144,330 A | | 11/2000 | Hoffman et al. |

FOREIGN PATENT DOCUMENTS

EP          0789459 A1      8/1997

OTHER PUBLICATIONS

S. Dabrel, et al., "Basic ESD and 1/0 Design," Wiley Interscience, John Wiley and Sons, Inc., New York 1998, pp. 150–171.

L. Clark, "A High–Voltage Output Buffer Fabricated on a 2V CMOS Technology", Intel Corporation, Chandler, Arizona, 1999, 2 pages.

* cited by examiner

Primary Examiner—Terry D. Cunningham
(74) Attorney, Agent, or Firm—Howard A. Skaist

(57) ABSTRACT

Briefly, in accordance with one embodiment of the invention, an integrated circuit includes: an output buffer. The output buffer includes semiconductor devices coupled to provide circuit configurations. The output buffer is adapted to couple to separate voltage supply voltage level ports and is further adapted to switch between the circuit configurations. The respective circuit configurations are respectively specifically adapted for interoperating with other integrated circuit chips, the respective threshold voltage levels of the semiconductor devices of different other integrated circuit chips being different.

8 Claims, 13 Drawing Sheets

OUTPUT BUFFER FOR HIGH AND LOW VOLTAGE BUS

BACKGROUND

1. Field

This disclosure is related to an output buffer and, more particularly, to an output buffer for an integrated circuit (IC) chip capable of interfacing to either one of a high and a low voltage bus or both.

2. Background Information

One problem that presents itself when coupling integrated circuit chips or IC's together is electrical compatibility. Typically, the integrated circuit chips are designed to operate at a particular input/output (I/O) voltage level or substantially within a particular restricted range of voltage levels. However, with advances in technology, the voltage levels at which integrated circuit chips operate, including for I/O, has been generally decreasing. Unfortunately, the trend for reducing voltages has been considerably faster for core logic, e.g., logic which does not interface to circuits outside the chip, than for I/O, e.g., circuits which primarily interface between chips. Consequently, recent ICs typically support I/O voltage levels which are higher than the core logic voltage levels. This allows for improved performance of the core independent of the support of legacy I/O voltage levels.

This general trend in the reduction of the I/O voltage levels may be an issue when designing or producing an integrated circuit chip. For example, an integrated circuit chip may be designed to operate with relatively high voltage signal levels. In this situation, the integrated circuit chip may not reach state-of-the-art performance levels, as measured by speed, power, and or both, for example, if designed to utilize high voltage tolerant transistors exclusively, although it will likely be compatible with legacy integrated circuit chips. Alternatively, the integrated circuit chip may operate at relatively low voltage levels and, therefore, be compatible with the voltage levels for state-of-the art integrated circuit chips, but may not be amenable to interfacing with legacy integrated circuit chips. For example, currently, but with no loss of generality, voltage levels of approximately 1.8 volts to approximately 3.3 volts may be considered relatively high, while voltage levels up to approximately 1 volt may be considered relatively low. It would be desirable if an approach or technique for producing or designing an integrated circuit chip provided the capability to address this issue.

SUMMARY

Briefly, in accordance with one embodiment of the invention, an integrated circuit includes: an output buffer. The output buffer includes semiconductor devices coupled to provide circuit configurations. The output buffer is adapted to couple to separate voltage supply voltage level ports and is further adapted to switch between the circuit configurations. The respective circuit configurations are respectively specifically adapted for interoperating with other integrated circuit chips, the respective threshold voltage levels of the semiconductor devices of different other integrated circuit chips being different.

Briefly, in accordance with another embodiment of the invention, an output buffer includes: a plurality of thick gate metal-oxide semiconductor (MOS) transistors coupled in a circuit configuration. The plurality includes, as pull-up transistors, at least a thick gate PMOS transistor and a thick gate NMOS transistor, both respectively being coupled between separate voltage supply voltage level ports and an output port of the output buffer. The plurality further includes, as pull-down transistors, at least two more thick gate NMOS transistors, both respectively being coupled between ground and the output port. At least one of the pull-up transistors and one of the pull-down transistors is coupled in the circuit configuration to be driven on hard and to deliver a high voltage swing. Furthermore, at least one of the pull-up transistors and one of the pull-down transistors is coupled in the circuit configuration to be driven on less hard and to deliver a reduced voltage swing.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As previously discussed, an issue in connection with designing and/or producing an integrated circuit chip is the input/output (I/O) voltage level, or range of levels, at which the integrated circuit chip is designed or intended to operate. As one particular example, not intended to limit the scope of the present invention in any way, an integrated circuit chip may be designed to operate at an input/output voltage level that falls within the range of from approximately 1.8 volts to approximately 3.3 volts. In this situation, without some form of adaptation at least, it is not likely the integrated circuit chip will also be compatible with or able to satisfactorily interoperate with another integrated circuit chip designed or intended to operate at an I/O voltage level falling within the range of from approximately less than 1.0 volts to approximately 1.0 volt.

Specifically, as transistor geometries are scaled by approximately 0.7 linearly each process generation, lower supply voltages are desired to support substantially constant electric field scaling employed for transistor reliability. These lower supply voltages are relatively easy to support for core or non-I/O circuits, as they typically only communicate among like transistors on an integrated circuit. However, transistor scaling roadmaps differ for different types of chips in a system. For example, the voltage levels for dynamic random access memory (DRAM) lags the voltage levels for logic due, at least in part, to the desire to support relatively high charge levels. Flash memories lag logic due, at least in part, to the desire to support very high (>10V) programming levels. However, logic, such as microprocessors and SRAM, typically benefit fully from voltage scaling. Thus, logic and SRAM processes, for example, typically have lower core supply voltages than the aforementioned memory devices with which they frequently interface.

Figure 3:
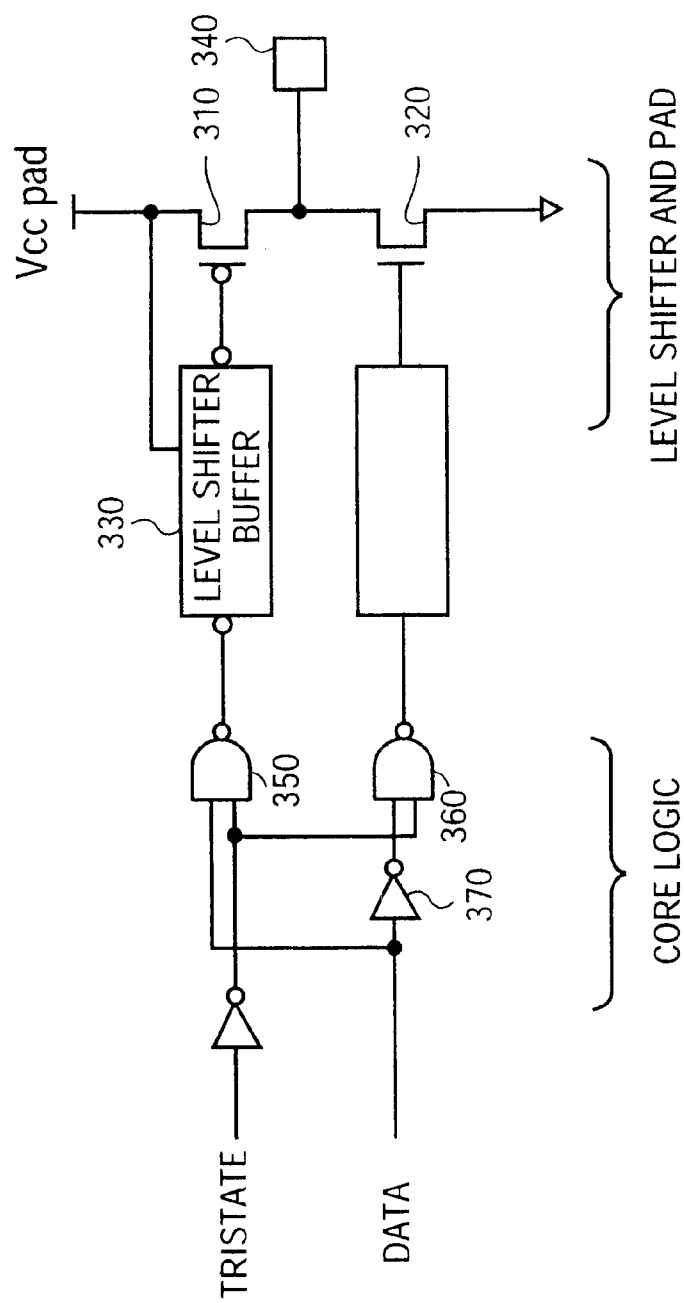
FIG. 3 is a circuit diagram illustrating an embodiment of a prior art output buffer.

This may introduce a power consumption issue for systems in which low power consumption is desirable, such as hand-held devices. Typically, the logic devices support higher voltage I/O through additional larger geometry transistors specifically added to support legacy I/O, as illustrated in FIG. 3 and described in more detail herein after. This in general addresses the voltage compatibility problem, however, driving or applying higher voltages to the greater off-chip capacitances may introduce greater power consumption than is desired. For example, on a device using a core logic voltage level of 1 V and an I/O voltage of 3.3V, the I/O uses approximately 10× the power that would be employed if the I/O was at the core voltage level of 1V.

Therefore, it may be desirable to allow the use of a lower voltage on a bus to reduce power consumption. However, it would also be desirable to do so in a manner that is amenable to implementation on semiconductor processes which are not the state-of-the-art logic processes targeted at low operating voltages. If this were accomplished such a technique or approach may then also be implementable on processes which have less aggressive voltage scaling, such as DRAM and non-volatile memory processes. Furthermore, it is desirable to have the technique or approach, such as a circuit, be tolerant and useable with legacy voltages, so that the same silicon or semiconductor chips may be used in either low or high voltage (legacy) I/O systems. Additionally, this lower voltage swing bus is desirable from a noise and signal slew rate perspective, as well as limiting the electromagnetic interference (EMI) produced by the board.

At present, a method of producing an integrated circuit chip intended to operate under various operating scenarios or at various I/O voltages is to simply allow the chip specifications to degrade. More specifically, such devices or integrated circuit chips are typically limited to one I/O voltage level or to an I/O voltage level falling within one specific or restricted range. Therefore, the output buffer is normally designed to operate with a defined performance for one set or range of operating conditions while it may support lower voltages at degraded speeds. This may be done, for example, by: (1) designing the buffer so that it operates successfully under worst case silicon or semiconductor processing extremes and taking steps to ensure that the external embodiment varies only over a specified or restricted range; (2) applying the previous techniques and then operating the output buffer within specifications by employing compensating techniques on the silicon or semiconductor die; or (3) allowing the output buffer to operate over a less restricted or specified range, but accepting some degradation in the performance level to which the chip or output buffer was specifically designed. Unfortunately, as will be appreciated by one of ordinary skill in the art, a given buffer can be utilized in this fashion only to a limited extent. Likewise, it will be appreciated that this limit will typically restrict the former approaches to allowing only a minor or modest increase in the range of voltages over which such a buffer may be employed satisfactorily.

In contrast, an embodiment of an output buffer in accordance with the present invention would permit the output buffer to operate effectively over a wide range of potential external environments and/or within a variety of different voltage level ranges, including voltages which are below the transistor fabrication process threshold voltage (Vt). In this context, the term threshold voltage is applied with respect to different transistor fabrication processes and refers to the gate-to-source voltage level below which a transistor fabricated substantially in accordance with that process is "off," or, at least to a first order, no current flow will occur through the transistor. Although the invention is not restricted in scope in this respect, for this particular embodiment, the potential range of operation is from approximately 0.7 volts, which is typical of low power hand held devices, to approximately 3.3 volts, which is typical of legacy interfaces. As shall be described in more detail hereinafter, in this particular embodiment, an approach is employed in which a pull-up transistor or semiconductor device is included in the output buffer, where the pull-up transistor is designed to provide improved performance for an I/O voltage level falling within a particular range of low voltage levels. However, a different pull-up transistor also may operate with satisfactory performance in the output buffer even at I/O voltage levels falling within a particular range of higher voltage levels, either solely or in conjunction with the first pull-up transistor. More specifically, for this particular embodiment, such as the embodiment illustrated in FIG. 1, for example, an N-channel thick gate transistor pull-up 110 with an over driven gate is utilized. In this context, a thick gate transistor refers to a transistor that has an oxide or other insulating material for its gate that can withstand a higher electric field from source or drain to gate and vice-versa, than is typically employed for a transistor fabricated substantially in accordance with the particular transistor fabrication process. More specifically, as fabrication process scaling is employed to improve transistor speeds, for example, the voltages applied and, likewise, the thickness of the transistor gates are reduced. Therefore, for such a scaled process, for example, for a transistor to withstand the application of a higher voltage and, therefore, withstand the application of a higher electric field, a thick gate is employed. Likewise, in this context, a gate having a normal or typical thickness for the particular process may be referred to as a thin gate.

Figure 1:
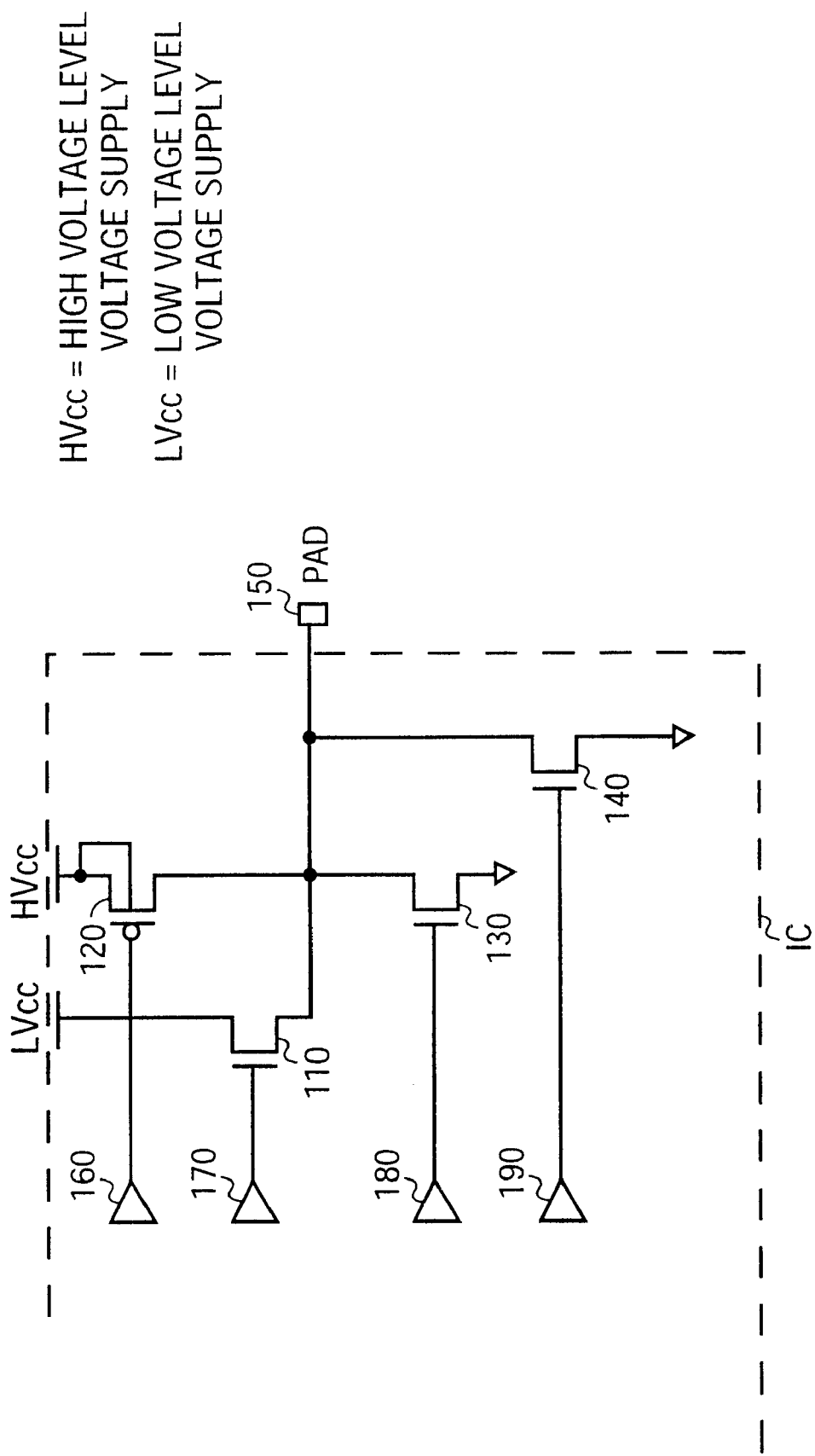
FIG. 1 is a circuit diagram illustrating one embodiment of an output buffer in accordance with the present invention.

The approach employed, such as, for example, by the embodiment in accordance with the invention of FIG. 1, is in contrast to state-of-the-art or traditional approaches that might be employed here, such as employing a P-channel transistor or a P-channel transistor with an N-channel source follower. One such traditional approach is illustrated, for example, in FIG. 3. As illustrated, transistors 310 and 320 couple to pad 340. It is noted that Vccpad is a higher voltage level than the voltage level employed for the core logic, such as, for example, 350, 360, and 370. Therefore, level shifter buffer 330 is employed between, for example, PMOS transistor 310 and NAND gate 350, so that the higher voltage I/O is supported. It is noted that level-shifting circuitry, such as 330, for example, is well-known. Although the invention is not limited in scope in this respect, an example of level-shifting circuitry is provided in U.S. patent application Ser. No. 09/272,76, titled "A 5-Volt Tolerant 3-Volt Drive Push-Pull Buffer/Driver," by L. Clark, filed on Mar. 18, 1999, (attorney docket: 042390.P6723), and assigned to the assignee of the present invention.

As previously indicated, FIG. 1 is a circuit diagram illustrating an embodiment 100 of an output buffer in accordance with the present invention. FIG. 1 illustrates embodiment 100 as implemented on an integrated circuit chip, although the invention is not limited in scope in this respect, such as a multiple drive voltage level output buffer. It will, of course, be appreciated that the other circuitry on the integrated circuit chip coupled to the output buffer may take any one of a number or variety of forms and the invention is not limited in scope to any particular circuitry. For example, the other circuitry of the integrated circuit chip may comprise a microprocessor, a microcontroller, a digital signal processor, or any one of a number of devices that are typically implemented on an integrated circuit chip.

As illustrated in FIG.1, output buffer 100 includes semiconductor devices, such as transistors 110, 120, 130, and 140. Likewise, it will be noted that, although these semiconductor devices are illustrated schematically as a single transistor, when implemented or manufactured, these may comprise more than one transistor, depending, for example, upon the application or the particular integrated circuit chip. For example, as is well-known, some form of digital and/or analog circuit compensation may be included to address the potential variation in circuit parameters known to occur as a result of the fabrication process. Although the invention is not limited in scope in this respect, such compensation techniques are described in the textbook, Dabral and Maloney, *Basic ESD and I/O Design*, available from Wiley Inter-science, pp 151–171, 1998. Therefore, the simplified circuit diagram in FIG. 1 is provided primarily for purposes of illustration and, as one of ordinary skill in the art will appreciate, when actually implementing a particular output buffer, more complex circuitry to provide a desired operation, such as the operation described in more detail hereinafter, may be employed. Thus, for example, as described and illustrated in pages 158–161 of the aforementioned text, although the invention is not restricted in scope in this respect, a plurality of transistors having sizes that are binary weighted may be coupled so that each of the transistors may be switched on and off independently to "tune" the overall collection of binary weighted transistors to achieve a particular impedance or effective transistor width, for example.

As shall also be explained in more detail hereinafter, output buffer 100 includes the previously described plurality of semiconductor devices, 110 to 140, coupled in a circuit configuration. In this embodiment, these devices are coupled so as to provide circuit configurations between which the output buffer may switch depending upon the situation or environment. In this particular embodiment, the output buffer may switch between two circuit configurations, as shall be described in more detail hereinafter, although the invention is not limited in scope to providing only two such circuit configurations. Likewise, as shall be described in more detail hereinafter, the respective circuit configurations are respectively specifically adapted for interoperating with other integrated circuit chips, the respective threshold voltages of the semiconductor devices of different other integrated circuit chips being different.

As illustrated in FIG. 1, in this particular embodiment, transistor 110 comprises an N-channel transistor, transistor 120 comprises a P-channel transistor, and transistors 130 and 140 each comprise N-channel transistors. Furthermore, the transistors in this particular embodiment of the output buffer all comprise transistors having a thick gate, e.g., a gate thickness which supports voltage levels which are typically encountered in legacy I/O, as previously described. For the embodiment described here, this voltage level is approximately 3.3V, but this should not be construed as limiting. Just to provide other examples, 2.5V or 5V are legacy voltage levels that might be supported. Likewise an alternative embodiment may include both thick and thin gate transistors, depending upon the particular application and configuration of the output buffer.

The operation of this particular embodiment of an output buffer in accordance with the present invention is as follows. For this particular embodiment, the output buffer may operate in "high voltage" or "low voltage" mode. It will, of course, be understood that, depending upon the particular semiconductor or transistor fabrication processing employed, the range of voltage levels for high voltage mode and/or low voltage mode may vary. For this particular embodiment, although the invention is not limited in scope in this respect, high voltage mode may comprise an I/O voltage level that falls within the range of from approximately 1.8 volts to approximately 3.3 volts. Likewise, low voltage mode for this embodiment may comprise an I/O voltage level that falls within the range of from approximately 0.7 volts to approximately 1.0 volt, although, again, the invention is not limited in scope in this respect. Therefore, for the output buffer embodiment illustrated in FIG. 1, operation in the high voltage mode occurs via PMOS pull-up transistor 120 driven by pre-driver 160. It is noted, in this particular embodiment, that when pre-driver 160 is asserted "low," transistor 120 is active or on and operating in its saturated or linear region of operation. For example, it may be saturated through most of the pad signal transition. Furthermore, transistor 120 is turned off or deactivated by driving pre-driver 160 to a "high" logic level, which, for this particular embodiment, is the voltage level supplied by the high voltage supply illustrated in FIG. 1, although, of course, the invention is not limited in scope in this respect. Likewise, for high voltage mode operation, NMOS pull-down transistor 130 is activated by asserting pre-driver 180 "high" and, again, in this particular embodiment, driving to a voltage level corresponding to the voltage level of the high voltage supply. Although the invention is not limited in scope in this respect, it is noted that pre-driver 190 may, likewise, be asserted "high" when applied to the gate of transistor 140 to successfully activate the pull-down operation of the output buffer in high voltage mode. Of course, the invention is not limited in scope to particular conventions regarding a logic "high" or a logic "low." Likewise, although in this particular embodiment, the pre-drivers are illustrated and described as separate circuit elements, these may alternatively be implemented with fewer pre-drivers that include level-shifting circuitry. Although the invention is not limited in scope in this respect, an example of such pre-drivers is provided in the aforementioned U.S. patent application Ser. No. 09/272,766, titled "A 5-Volt Tolerant 3-Volt Drive Push-Pull Buffer/Driver," by L. Clark.

In contrast, in low voltage mode operation, transistor 110, which comprises an NMOS transistor in this embodiment, operates as a pull-up transistor. Likewise, in this particular embodiment, transistor 110 is activated by driving pre-driver 170 to a logic high; however, in this particular embodiment, pre-driver 170 drives transistor 110 where the voltage level across the drain to source channel of transistor 110 corresponds to the low voltage supply rather than the high voltage supply. More specifically, for this embodiment, whereas in high voltage mode operation pre-drivers 160 and 180 drive their respective transistors on "hard," eg., "simulating" an output impedance of 20 ohms or below, considerably less than the printed circuit board transmission line characteristic impedance. In low voltage mode operation pre-drivers 170 and 190 drive their respective transistors on "less hard," eg., "simulating" an output impedance which approximates the board transmission line impedance. Additionally, in low voltage mode the pre-driver overdrives both the pull-down and pull-up NMOS devices, providing better drive than otherwise and keeping these devices in the linear mode of operation for a greater range of pad signal swing, which improves the matching with the board transmission line as will be described later in detail. In this particular embodiment, this is due, at least in part, to the respective sizes of the transistors. The transistors driven by pre-drivers 160 and 180 are relatively larger than the transistors driven by pre-drivers 170 and 190. Likewise, it is noted that when a high logic signal is applied to NMOS transistor 110, pre-driver 160 is "de-asserted" at a high logic level, therefore, leaving PMOS transistor 120 activated. It is further noted that regardless of high voltage mode operation or low voltage mode operation, a full swing from the particular voltage supply level for a logic high to ground is provided by the output buffer. However, the voltage swing in low voltage mode is reduced relative to the swing in high voltage mode. As shall be described in more detail hereinafter, this particular embodiment permits overdrive operation with semiconductor devices produced or fabricated using processes that produce a high or relatively high threshold voltage due, at least in part, to thick gate transistors that tolerate high voltage levels being applied across the transistors.

Figures 1, 2:
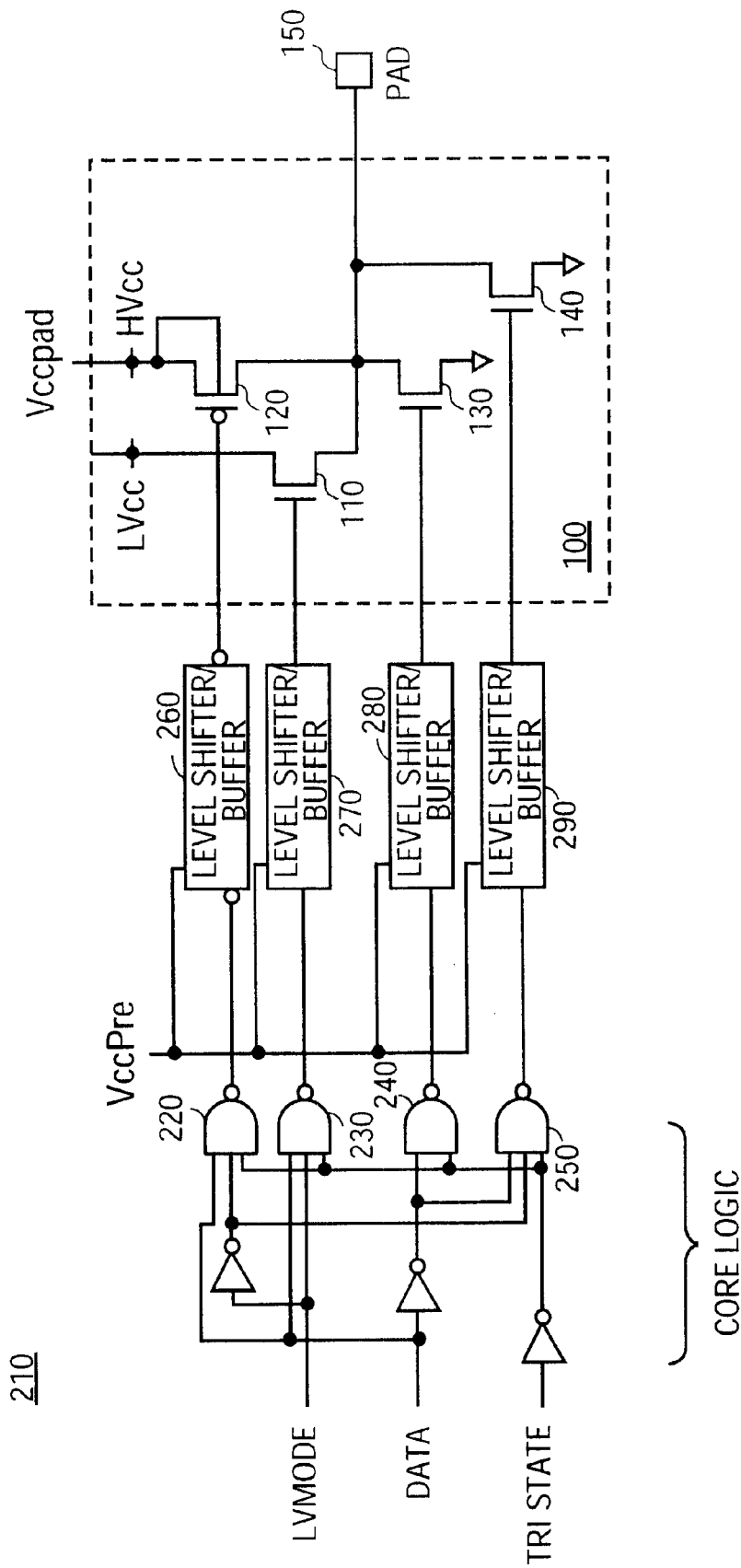
FIG. 2 is a first and a second circuit diagram illustrating the embodiment of FIG. 1 as implemented on a low core voltage device and a high core voltage device, respectively.
Figure 2:
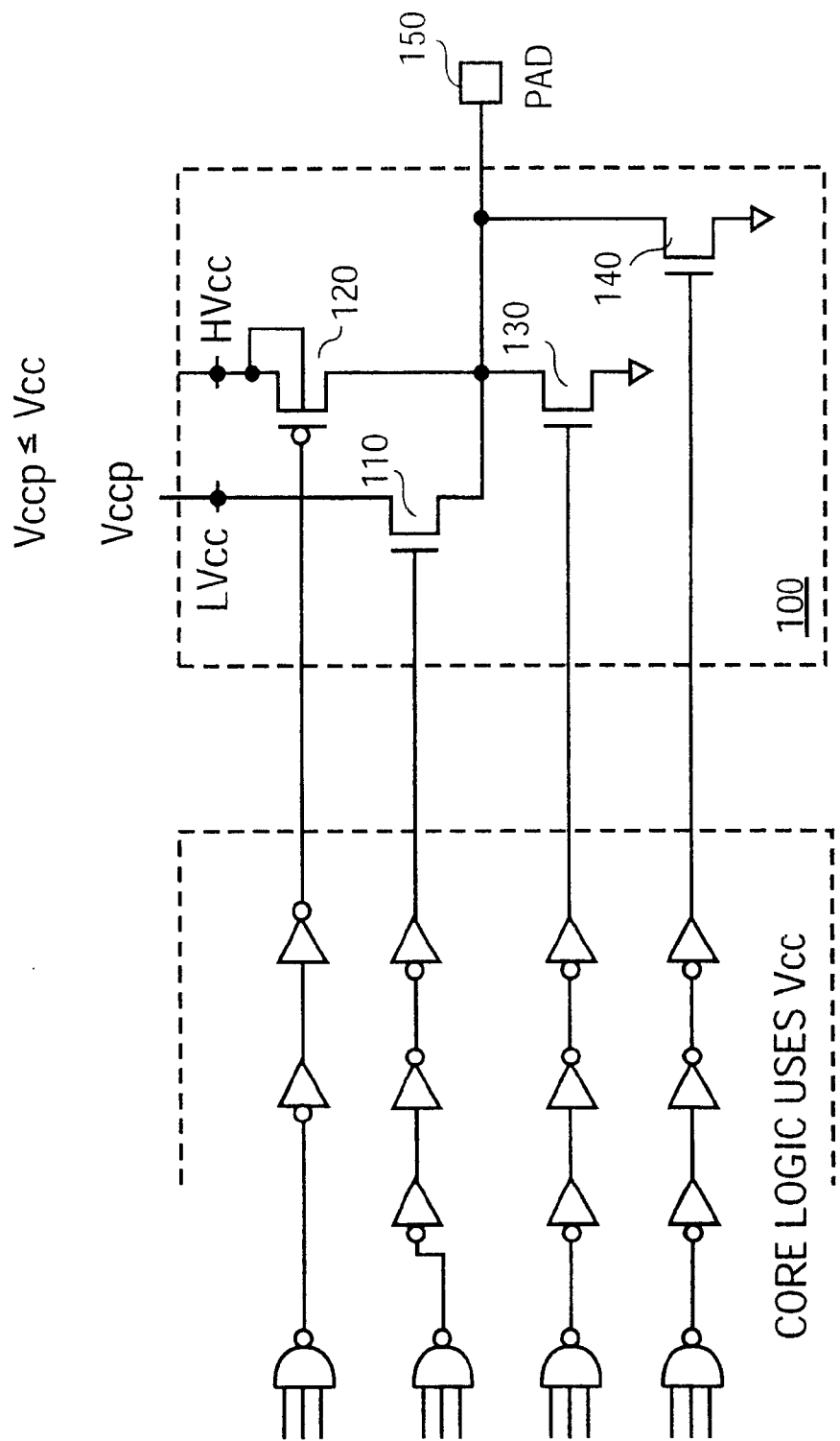

FIG. 2 includes circuit diagrams illustrating the embodiment of FIG. 1 as implemented on a low core voltage device and a high core voltage device, respectively. Of course, these are provided merely as examples and the invention is not limited in scope to these particular embodiments. Embodiment 210 illustrates an approach that may be employed for a low core voltage device. Therefore, this embodiment supports both high and low voltage modes, such as those previously described. This embodiment of an output buffer includes transistors 110, 120, 130, and 140, as well as pad 150. Likewise, these transistors are driven by level-shifter/buffers 270, 260, 280, and 290, respectively. The digital logic that couples to these level-shifter/buffers, such as NAND gates 230, 240, 250, and 260, for example, operate at the core voltage level, which is lower than Vccpad in FIG. 2-1.

Figure 12:
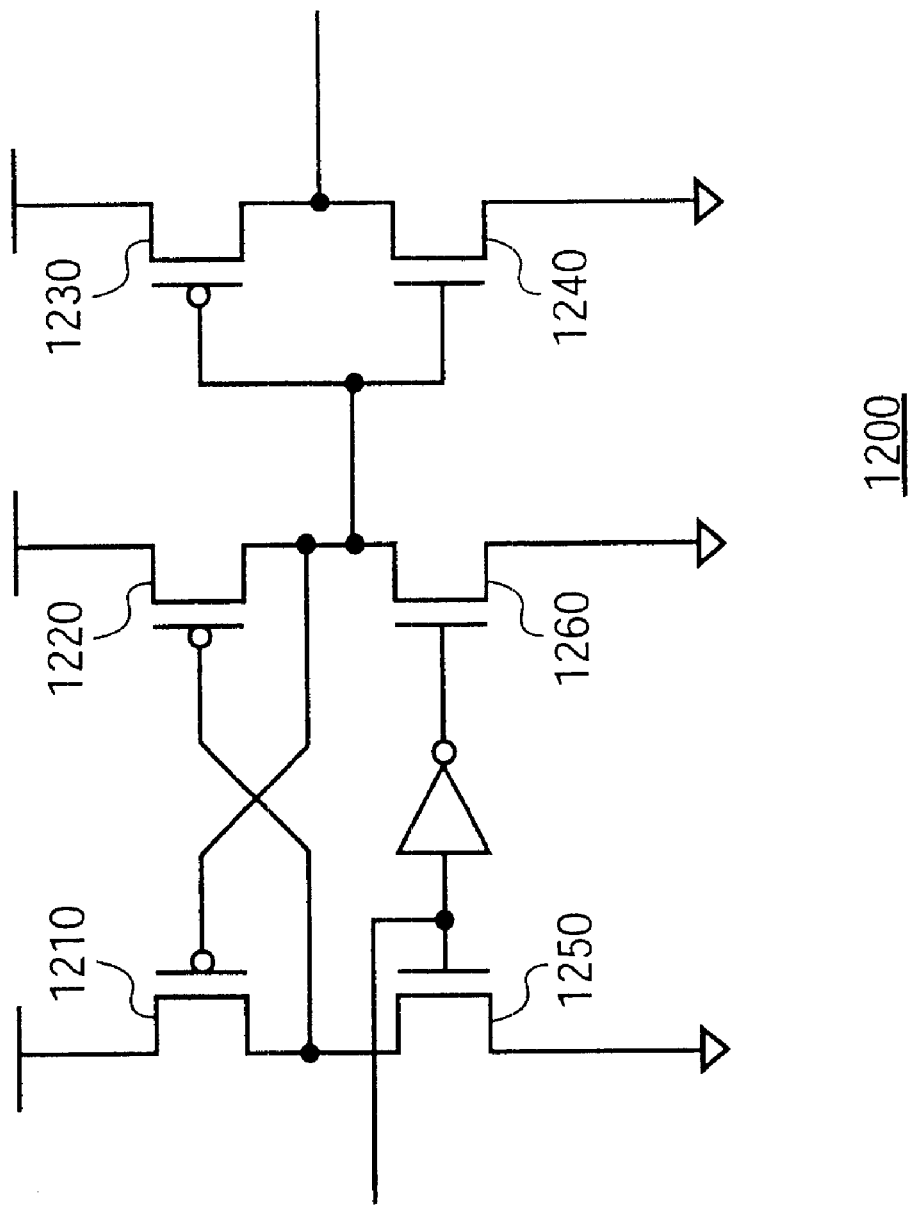
FIG. 12 is a circuit diagram illustrating an embodiment of a level-shifting buffer that may be employed, for example, in conjunction with an embodiment of an output buffer in accordance with the invention, such as illustrated, for example, in FIG. 2.

Although the invention is not limited in scope in this respect, one embodiment of a level-shifter/buffer that may be employed is illustrated in FIG. 12. This particular embodiment of a level-shifter/buffer is described in more detail in the aforementioned U.S. patent application Ser. No. 09/272,766, titled "A 5-Volt Tolerant 3-Volt Drive Push-Pull Buffer/Driver," by L. Clark, and, therefore, shall not be described in detail here. However, any circuitry that provides the desired level shifting operation will suffice and this is just one example of a possible implementation. One advantage of using this embodiment, although other embodiments may also provide a similar advantage, is that the level shifter have a greater output voltage swing than the output voltage swing of the output buffer being driven, at least when the output buffer operates in low voltage mode. This allows the gates of the output buffer transistors to be overdriven permitting use of transistors having a relatively high threshold voltage with a low voltage bus. Likewise, although, again, the invention is not limited in scope in this respect, where appropriate, a vertical drain NMOS (VDNMOS), such as described in U.S. patent application Ser. No. 09/109,231, titled "Transistor Device Configurations for High Voltage Applications and Improved Device Performance," by Adam Brand, filed on Jun. 30, 1998, (attorney docket: 04230.P5591), and assigned to the assignee of the present invention, may be employed. Therefore, for the embodiment shown in FIG. 12, transistors 1210, 1220, 1230, and 1240 comprise thick gate MOS transistors, whereas transistors 1250 and 1260 comprise thin gate VDNMOS transistors.

Referring again to FIG. 2—2 embodiment 215 illustrates an approach that may be employed for a high core voltage device, that is, one in which the bus voltage level and the core voltage level are equal or at least approximately equal. Therefore, this embodiment supports high voltage mode. Again, this embodiment of an output buffer includes transistors 110, 120, 130, and 140, as well as pad 150. However, this particular embodiment does not employ level shifting, although, it is noted that some buffering may be employed. The digital logic that drives these transistors, such as NAND gates 225, 235, 245, and 255, for example, operates at the core voltage level, which is approximately equal to Vccp in FIG. 2—2.

Figure 4:
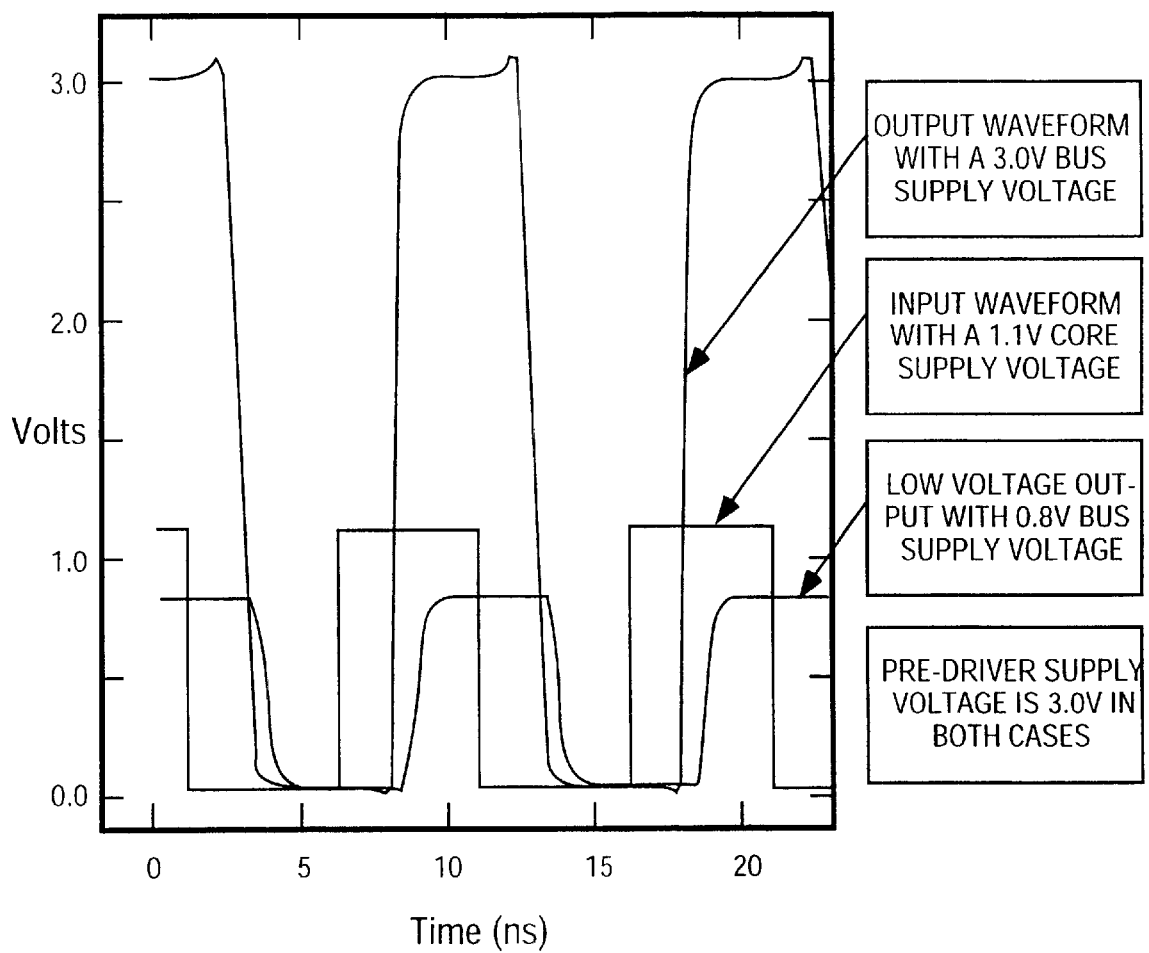
FIG. 4 is a plot of waveforms that may be produced by an embodiment of an output buffer in accordance with the present invention, such as the one shown in FIG. 1, based on a simulation of the operation of the circuitry in both high and low voltage modes.

FIG. 4 is a plot of waveforms that may be produced by an embodiment in accordance with the present invention, such as the one shown in FIG. 1, based on a simulation of the operation of the circuitry in both high and low voltage mode. For this simulation, the core voltage level employed was 1.1 volts, the voltage level of the low voltage bus was 0.8 volts and the voltage level of the high voltage bus was 3.0 volts. The plot illustrates the data input waveform and both output waveforms produced for high voltage mode and low voltage mode.

Based on computer simulation results, the pull-up transistor operates in the linear region of operation for the entire voltage range in the low voltage mode. Conversely, the pull-down transistor operates linearly or in its linear region of operation up to one $V_{DSAT}$ above $V_{SS}$ or, in this particular embodiment, ground, in low voltage mode. Because the transistors operate in their linear region of operation, this provides the capability for the output buffer, at least in low voltage mode operation, to be "source terminated" and, therefore, effectively absorb, or at least partially absorb, voltage reflections returning from the far end of an effective transmission line that is created or produced when the integrated circuit chip is coupled to another integrated circuit chip via a bus. Therefore, the use of a source terminated bus scheme may be employed to dampen overshoot voltages and reflections, for example.

Figure 5:
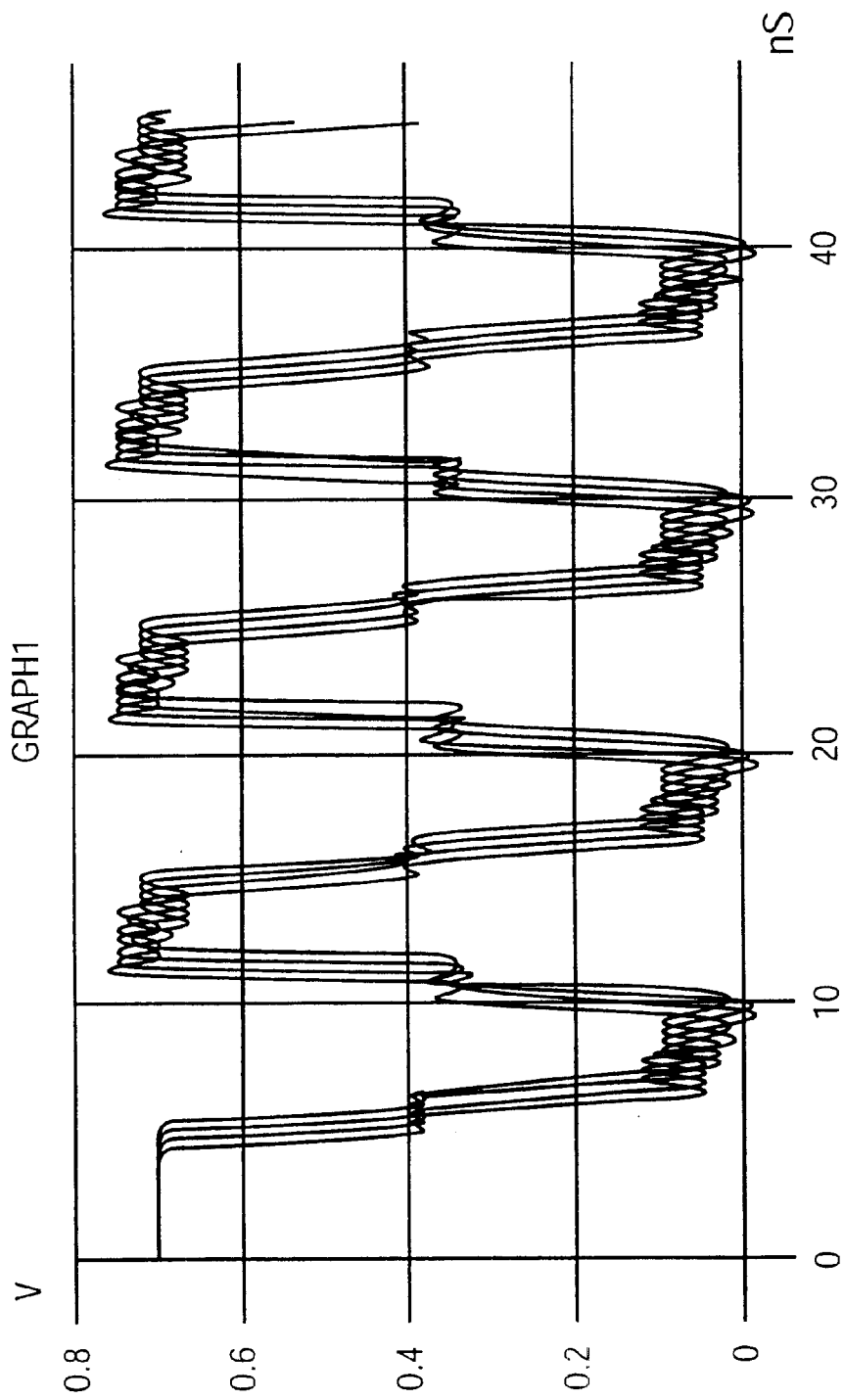
FIG. 5 is a plot of a waveform that may be produced by an embodiment of an output buffer in accordance with the present invention, such as the one shown in FIG. 1, based on a simulation of the operation of the circuitry in a "source-termination" scheme supported in low voltage mode.

FIG. 5 is a plot illustrating a waveform that may be produced by an embodiment of an output buffer in accordance with the present invention, where a source terminated bus scheme is employed. Here, the board transmission line characteristic impedance is 50 ohms and the pull-up is matched to 50 ohms by tuning the effective width at the gate voltage provided, as previously described herein, while the pull-down is tuned over its linear region in a similar fashion. FIG. 5 is a plot produced by a computer simulation developed to mathematically model the operation of the output buffer. For this simulation, the waveforms are driven onto the bus measured at each receiver with a 0.7 volt swing using high voltage transistors. Although the termination is imperfect, it is adequate to keep the signals well behaved at a 100 MHz rate. Thus, the amount of ringing illustrated will be tolerable for most applications. The taps are located equidistant along a 10 cm 50 ohm transmission line. The line is driven from an end and the transistors are sized to match the line impedance. It is, of course, noted that when employed on an IC, there may also be some "tuning" or compensation of transistor widths, such as, for example, previously described, in order to successfully employ a source terminated scheme that matches the impedance of the environment in which an embodiment of an output buffer in accordance with the invention is to be employed. Actual component placement on the circuit board may differ and may affect the reflection magnitude.

Again, although the invention is not limited in its scope in this respect, output buffer 100 includes a plurality of thick gate MOS transistors coupled in a circuit configuration, such as illustrated in FIG. 1. As noted above, this particular circuit configuration provides two circuit configurations, although the invention is not limited in scope in this respect. Nonetheless, the plurality includes, as pull-up transistors, at least a thick gate PMOS transistor and a thick gate NMOS transistor, such as transistors 110 and 120, both respectively being coupled between the separate voltage supply ports and an output port of the buffer, such as output pad 150 illustrated in FIG. 1. Likewise, as illustrated in FIG. 1, the separate voltage supply ports are intended to provide supply voltages that have different voltage levels, such as a high voltage level and a low voltage level, as previously described. The plurality of transistors, further includes, as pull-down transistors, at least two more thick gate NMOS transistors, such as transistors 130 and 140, both respectively being coupled between ground and the output port of the output buffer, such as pad 150. Likewise, at least one of the pull-up transistors, such as transistor 120, and one of the pull-down transistors, such as transistor 130, is coupled in this circuit configuration to be driven on hard and to deliver a high or large voltage swing, whereas at least one of the pull-up transistors, in this embodiment the other pull-up transistor 130, and one of the pull-down transistors, in this embodiment the other pull-down transistor 140, is coupled in this circuit configuration to be driven on less hard and deliver a reduced voltage swing, as previously described. Of course, as previously indicated, there also may be additional pull-up and pull-down transistors in alternative embodiments. As previously described, the output buffer is coupled to switch between alternate pull-up and pull-down transistors and respectively apply different voltages to drive the transistors in the respective circuit configurations in this particular embodiment.

Figure 6:
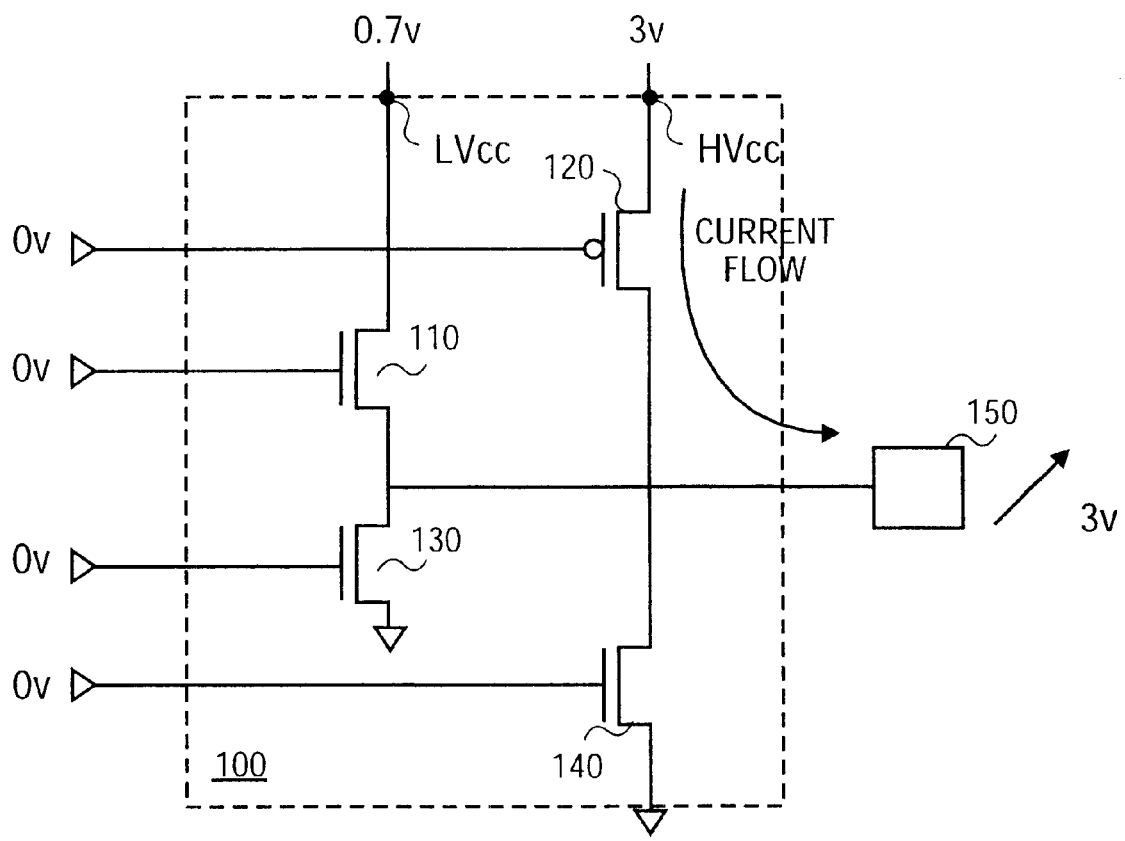
FIGS. 6–10 are circuit diagrams illustrated the embodiment of FIG. 1 in various operating modes.
Figure 7:
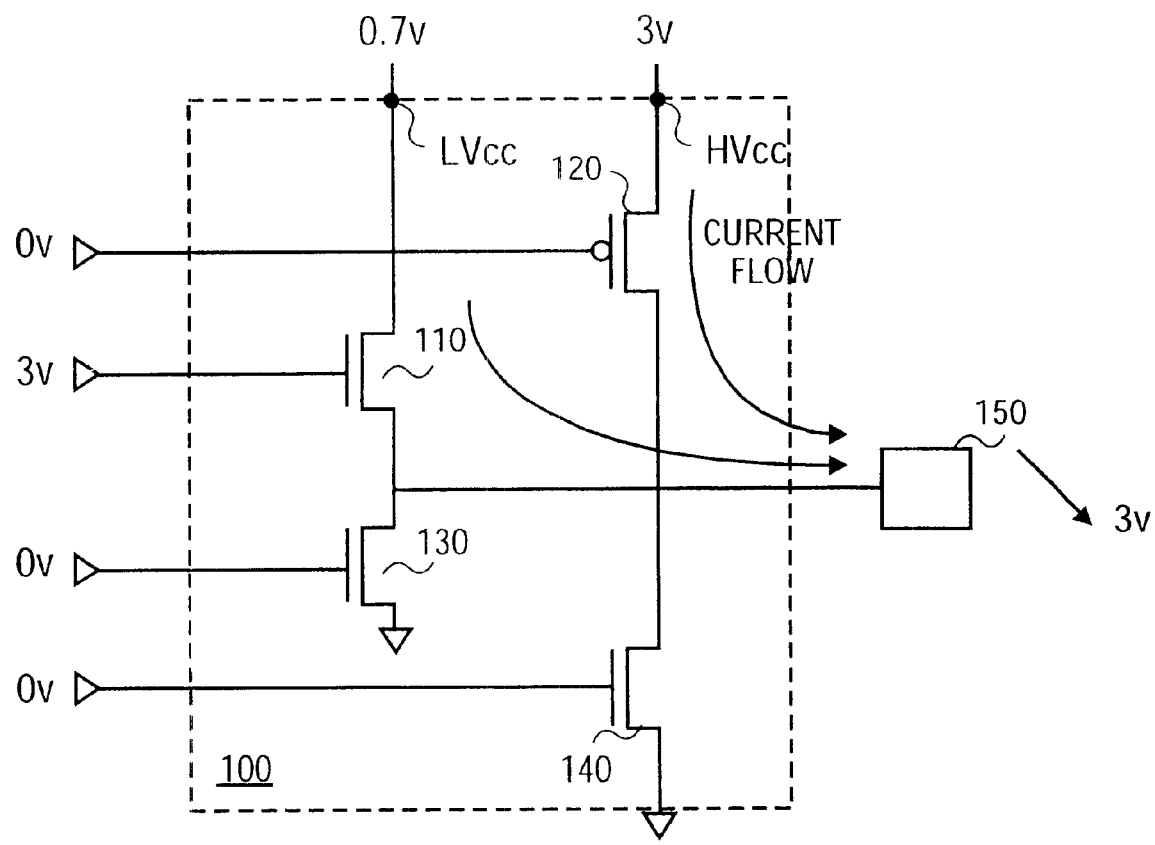
Figure 8:
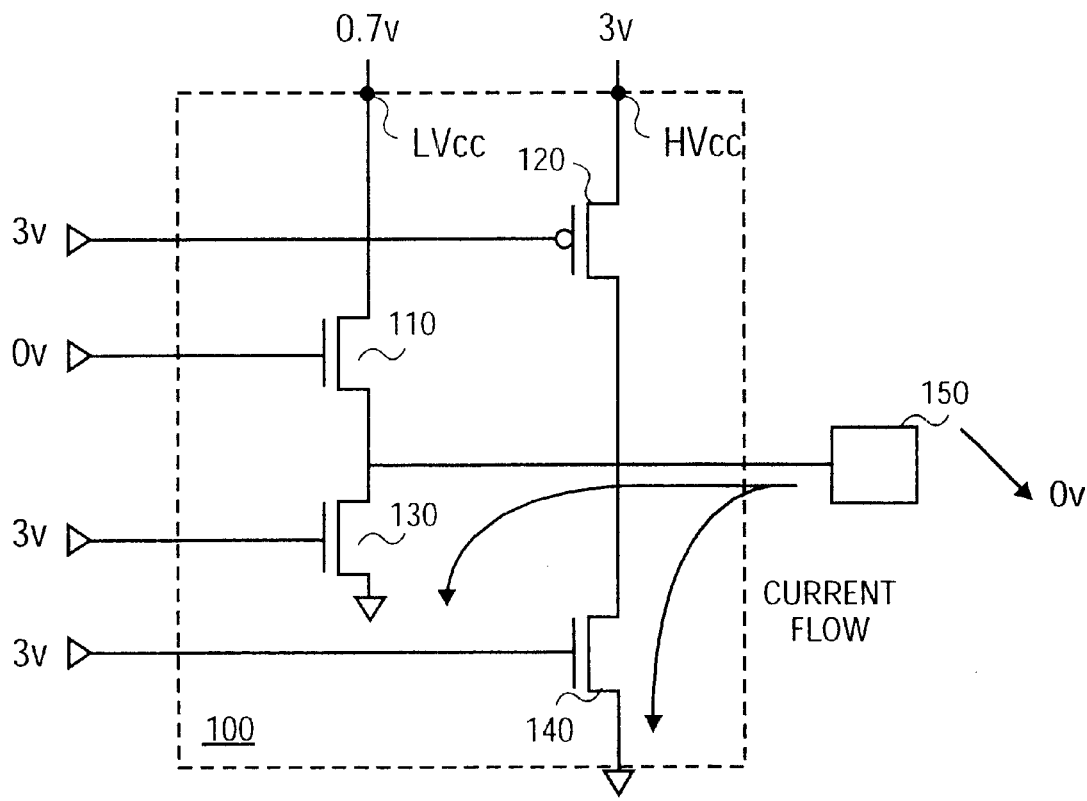
Figure 9:
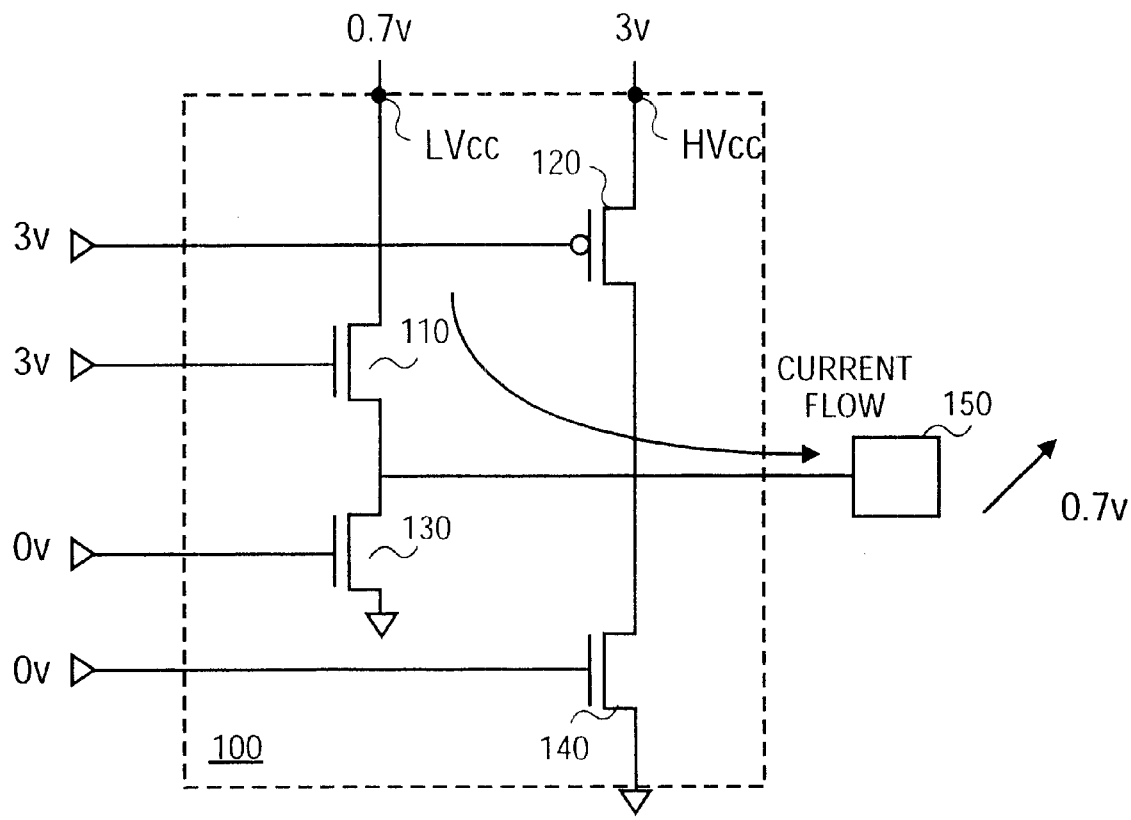
Figure 10:
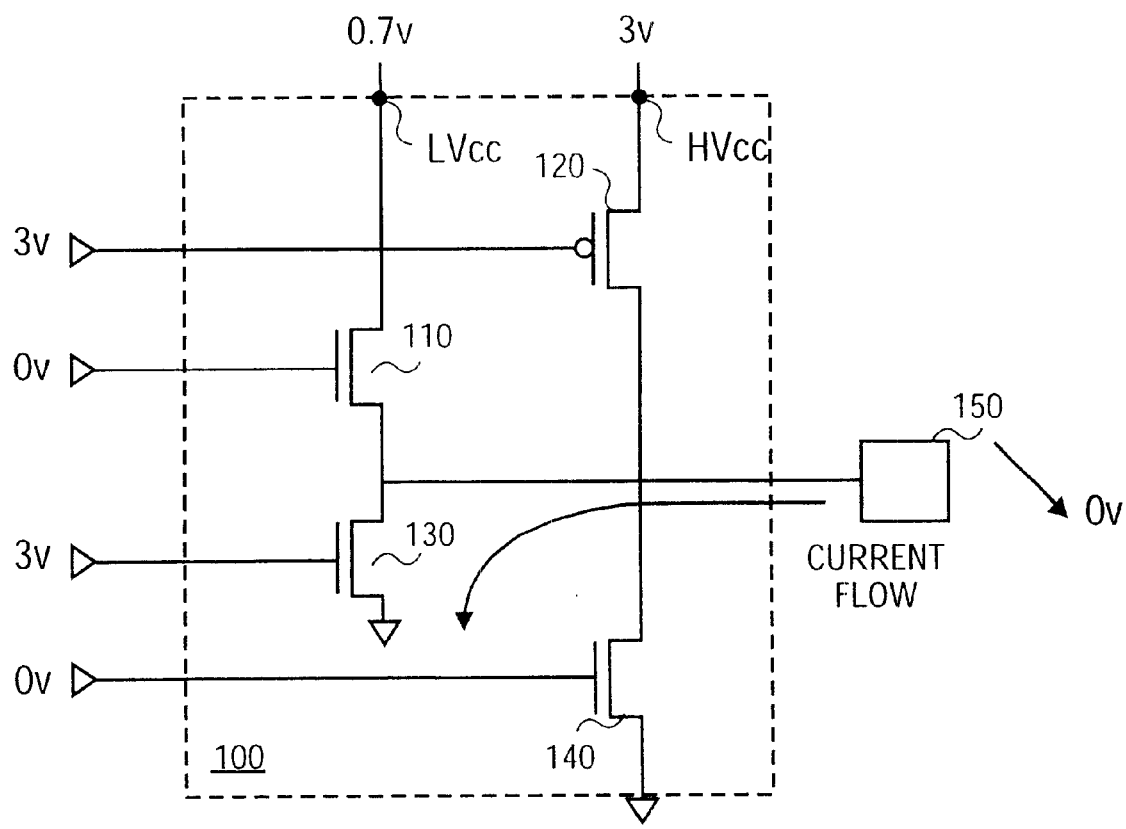

FIGS. 6–10 are circuit diagrams illustrating an embodiment of the invention various operating modes, such as previously described. Of course, these are merely provided for purposes of illustration and the invention is not limited in scope to these particular modes of operation. FIGS. 6–8 illustrate high voltage mode and FIGS. 9–10 illustrate low voltage mode. In FIG. 6, assuming a voltage supply of 3 volts, as illustrated, transistor 120 is active or on, and, therefore, "pulling up" the voltage of pad 150 to 3 volts in this embodiment. Transistors 110, 130, and 140 are off for this pull up case. FIG. 7 illustrates an alternative approach in which pad 150 is pulled up in high voltage mode. In this approach, both transistors 120 and 110 are active. Therefore, 3 volts, in this embodiment, are applied to the gate of transistor 110, whereas in FIG. 6, zero volts had been applied to the gate. FIG. 8 illustrates the high voltage pull down situation. Therefore, transistors 130 and 140 are active, whereas transistors 110 and 120 are off or inactive. In this situation, pad 150 is pulled to ground. It is also noted that for this situation and embodiment, applying 3 volts to the gate of transistor 120 turns it off.

FIGS. 9 and 10 illustrate low voltage mode for this particular embodiment. In FIG. 9, only transistor 110 is active, and, therefore, pad 150 is pulled up to 0.7 volts, which, in this embodiment, is the voltage level of a low voltage bus. In contrast, in FIG. 10, only transistor 130 is active, pulling pad 150 to ground. As previously described, these transistors are designed so that improved performance may be obtained in a low voltage mode of operation.

Figure 11:
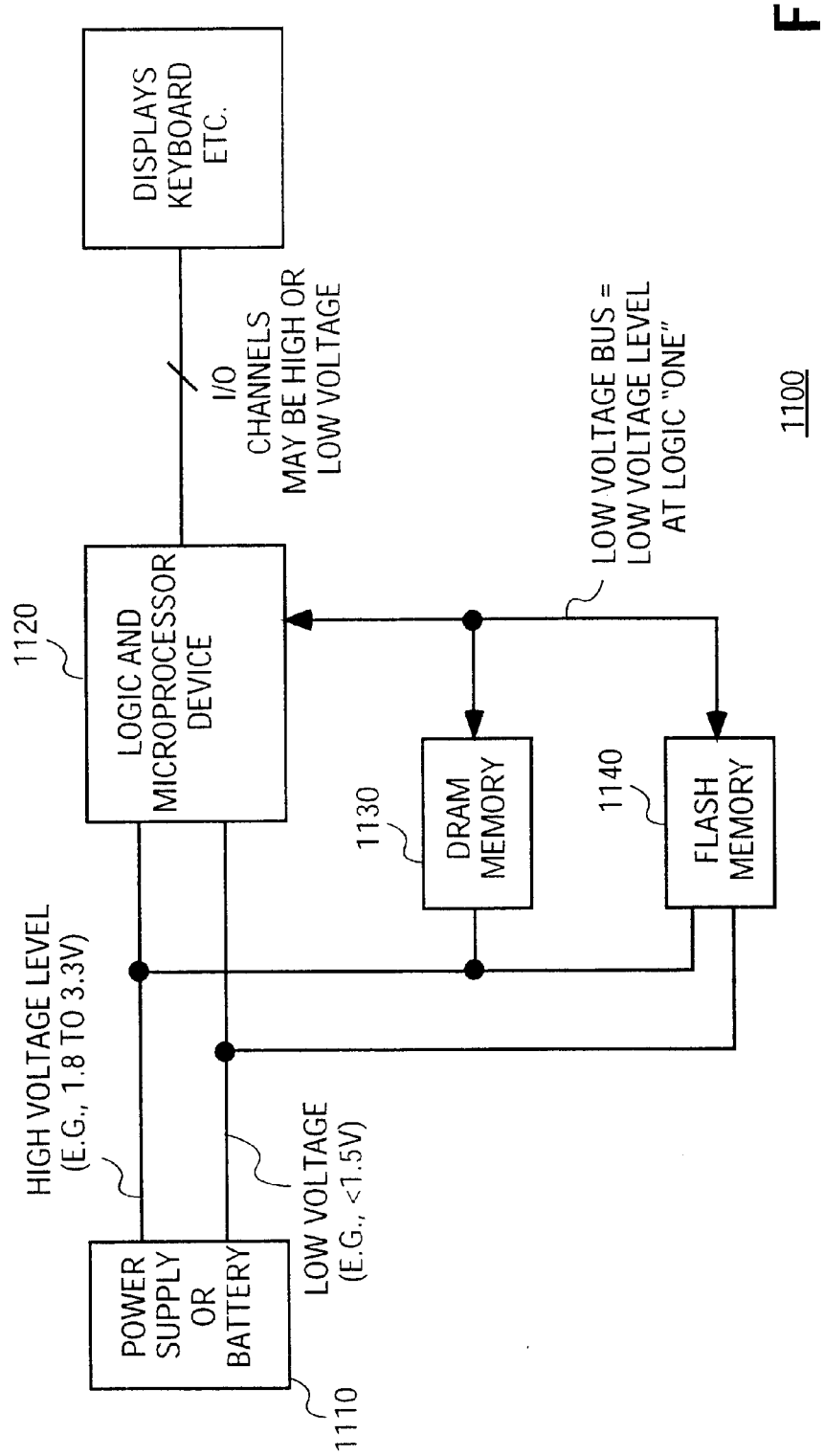
FIG. 11 is a schematic diagram illustrating an embodiment of system that may employ an embodiment of an output buffer in accordance with the invention.

FIG. 11 is a schematic diagram illustrating an embodiment of a system 1100, such as, for example, a computer system or computing platform that may employ an embodiment of an output buffer in accordance with the present invention. As illustrated, in this embodiment, power supply 1110 includes a high voltage level, such as 1.8 to 3.3 volts, and a low voltage level, such as below 1.5 volts. In this embodiment, devices 1120, 1130 and 1140 all couple to both the high and low voltage level of supply 1110, but this is not unusual for such a system. Device 1120, which includes logic and a microprocessor in this embodiment, includes an embodiment of an output buffer in accordance with the invention. Therefore, the low voltage level is applied for the core logic, whereas the high voltage level is applied for I/O. It is noted that a low voltage bus couples 1120 to DRAM 1130 and flash 1140; however, the bus coupling 1120 to various I/O devices, such as a display, keyboard, etc., may be high voltage or low voltage. The low voltage level applied to DRAM 1130 and flash 1140 in this embodiment is employed for the low voltage bus. It will, of course, be appreciated that any one of a number of other systems may employ an embodiment of an output buffer in accordance with the invention. For example, 1130 may be replaced by SRAM, SDRAM, etc. Likewise, 1140 may be replaced by any non-volatile memory, such as, for example, EEPROM. Likewise, many other system architectures may be employed other than the one illustrated.

As previously alluded to, although the invention is not limited in the scope in this respect, in another embodiment, the same pre-driver circuitry, or at least portions of the same pre-driver circuitry, may be employed for both the transistors to be driven on hard and the transistors to be driven on less hard by employing pre-drivers that have the capability to shift voltage levels from a relatively low voltage level, such as in the range of from approximately 0.7 to approximately 1.0 volts, to a relatively high voltage level, such as in the range of from approximately 1.8 to approximately 3.3 volts. Thus, the same or essentially the same pre-drivers circuitry may be used in a level shifted mode for the interfaces for both the transistors intended to provide the low voltage mode operation and the transistors intended to provide high voltage mode operation. This provides an advantage in terms of utilizing less silicon or semiconductor area of the chip.

Although the invention is not limited in scope in this respect, one advantage of this particular embodiment is that it provides the capability to support dynamic RAM (DRAM) as well as derivative memory devices, such as synchronous DRAM (SDRAM) and/or the capability to support multiple I/O voltage levels for operation, or interoperation, with devices that have not achieved the low voltage levels that have been achieved for a number of other types of integrated circuits, such as, for example, microprocessors and/or microcontrollers. Similarly, such higher voltage levels may also be desired for interoperating with flash memory, although, again, the invention is not limited in scope in this respect.

Again, although the invention is not limited in scope to the previously described embodiment, nonetheless, it has a number of potential advantages. As previously indicated, transistor 110, which in this particular embodiment comprises an N-channel transistor, provides current properties that are more stable than employing a P-channel transistor, which, as previously described and illustrated, is the traditional approach. This is due, at least in part, to the N-channel transistor operating in a linear region of operation of the transistor, rather than in the saturation region. Furthermore, as previously described and illustrated, this linear region of operation also allows source termination to be employed in low voltage mode for an embodiment of an output buffer in accordance with the invention, which addresses some of the impedance matching issues that may typically arise for integrated circuit chips coupled via a bus. Yet another advantage of employing an N-channel transistor, such as 110, instead of a P-channel transistor, such as illustrated in FIG. 3, for example, is that N-channel transistors typically do not suffer from drain current saturation degradation at low voltages, as may typically occur for a P-channel transistor. Specifically, use of an NMOS device allows the gate to be overdriven. Accomplishing similar overdrive with a PMOS pull-up would be problematic as it may entail the use and generation of negative voltages on chip. This effectively means that, by employing an N-channel transistor instead of a P-channel transistor, the need for a larger transistor has been avoided while accomplishing the same or substantially the same level of performance. Another advantage of employing an N-channel transistor rather than a P-channel transistor is that, due to the availability of a relatively high voltage supply to drive the transistors, this approach is amenable to implementation on a much broader variety of silicon or semiconductor fabrication processes. More specifically, for silicon or semiconductor fabrication processes that produce transistors having a relatively high threshold voltage, it would be difficult to employ a P-channel transistor and support these processes, due to the range of voltages that would be desirable in order to drive the P-channel transistor in active mode. However, because an N-channel transistor, having a polarity opposite the P-channel, is employed, the relatively high voltage supply may be utilized, e.g., providing the ability to apply a gate voltage higher than the drain to source (output swing) voltage. Yet another advantage is that the penalty of providing an output buffer capable of operating in dual modes and, therefore, providing a wide range of I/O voltage level compatibility, for this embodiment, is relatively small. More specifically, the amount of silicon or semiconductor area consumed by the transistors for this particular embodiment tends to be dominated by the transistor sizes to be employed for electrostatic discharge (ESD) diffusion diodes, as these considerations result in providing relatively large transistors, such as transistors 120 and 130 in FIG. 1. In a conventional buffer, the large PMOS and NMOS drains provide this function, and they do here. Therefore, where this function is desired, these transistors would still be employed (and would substantially occupy the same area) if only the low-voltage mode of operation were provided. Thus, the area penalty of supporting both modes is relatively small. In contrast, the additional silicon or semiconductor area employed to provide transistors 110 and 140, which provide the flexibility to have two modes of operation for the output buffer, is relatively small. Likewise, as previously described, although the invention is not limited in scope in this respect, the output buffer may, in an alternative embodiment, also share pre-driver circuitry, so that effectively two separate buffers are provided in a single circuit configuration, where the separate or alternative buffers are enabled or disabled depending upon the voltage environment in which they are to be used. Furthermore, providing the capability to have an output buffer operating in alternative voltage modes, one voltage mode being high relative to the other voltage mode, results in an integrated circuit amenable to implementation on nearly any commonly used complementary metal-oxide semiconductor (MOS) fabrication process, including processes employed to produce DRAM, flash memory, and logic circuits.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A multiple drive voltage level output buffer comprising:

a plurality of thick gate MOS transistors coupled in a circuit configuration;

said plurality including as pull-up transistors, at least a thick gate P-channel MOS (PMOS) transistor and a thick gate N-channel MOS (NMOS) transistor, both respectively coupled between separate voltage supply voltage level ports and an output port of said output buffer;

said plurality further including as pull-down transistors, at least two more thick gate NMOS transistors, both respectively coupled between ground and said output port;

wherein at least one of said pull-up transistors and one of said pull-down transistors being coupled in said circuit configuration to be driven on hard and provide a high voltage swing; and wherein another of said pull-up transistors and one of said pull-down transistors being coupled in said circuit configuration to be driven on less hard and provide a reduced voltage swing.

2. The multiple drive voltage level output buffer of claim 1, wherein at least one of the pull-up and pull-down transistors comprise a plurality of transistors coupled so as to emulate a transistor having approximately a particular transistor width.

3. The multiple drive voltage level output buffer of claim 2, wherein a first of said pull-up transistors and a first of said pull-down transistors are specifically adapted to provide better electrical performance than a second of said pull-up transistors and a second of said pull-down transistors for a specific mode of operation that depends, at least in part, voltage supply voltage level.

4. The multiple drive voltage level output buffer of claim 3, wherein the thick gate PMOS pull-up transistor is coupled to be driven on hard during high voltage mode circuit operation and the thick gate NMOS pull-up transistor is coupled to driven on less hard during low voltage mode circuit operation.

5. The multiple drive voltage level output buffer of claim 3, wherein the thick gate PMOS pull-up transistor and the thick gate NMOS pull-up transistor are coupled to be driven on during high voltage mode circuit operation.

6. The multiple threshold voltage level output buffer of claim 3, wherein both thick gate NMOS pull-down transistors are coupled to be driven on during high voltage mode operation.

7. The multiple threshold voltage level output buffer of claim 3, wherein at least one of the thick gate NMOS pull-down transistors is coupled to be driven on hard during high voltage mode operation.

8. The multiple threshold voltage level output buffer of claim 7, wherein at least one of the thick gate NMOS pull-down transistors is coupled to be driven on less hard during low voltage mode operation.

* * * * *